Jan. 27, 1970 T. J. HUTTON 3,492,587

RANDOM FUNCTION GENERATOR

Filed May 25, 1967 2 Sheets-Sheet 1

INVENTOR
Thomas J. Hutton.
BY
W. L. Stout
HIS ATTORNEY

United States Patent Office 3,492,587
Patented Jan. 27, 1970

3,492,587
RANDOM FUNCTION GENERATOR

Thomas J. Hutton, Swissvale, Pa., assignor to Westinghouse Air Brake Company, Swissvale, Pa., a corporation of Pennsylvania Filed May 25, 1967, Ser. No. 641,220
Int. Cl. H03k 3/04
U.S. Cl. 328—61 12 Claims

ABSTRACT OF THE DISCLOSURE

A delta time duration signal generator having discrete random time intervals between the delta time duration signals and having a random noise signal source and a periodic signal source in combination with a signal gate which is operatively coupled to both signal sources. A counter is operatively coupled respectively to the signal gate and a unit which produces a signal of delta time duration. This delta time duration signal producing unit alternately enables the signal gate to pass the noise signal and the periodic signal to the counter, which results in the counter being driven by the noise signal for a period measured by the delta time duration signal. At the end of this time period the counter will have arrived at a count level, which count level has a completely random quality due to randomness of the noise source. Then the periodic signal will be passed by the signal gate to drive the counter to a filled state at which time the counter will produce an output to control the delta time duration signal source. The appearance of this counter signal output will initiate the enabling of the signal gate to again pass the noise signal to the counter as well as permit the delta time duration signal source to produce an output signal of delta time duration at discrete random time intervals.

This invention relates to a random function generator. More specifically, this invention relates to a delta time duration signal generator having discrete random time intervals between said delta time duration signals and having a first signal source for producing a random noise signal and a second signal source for producing a periodic signal in combination with a signal gate which is operatively coupled to the first and the second signal source. A counter is operatively coupled respectively to the signal gate unit and a unit which produces a signal of delta time duration. This delta time duration signal producing unit alternately enables the signal gate to pass the noise signal and the periodic signal to the counter, which results in the counter being driven by the noise signal for a period measured by the delta time duration signal. At the end of this time period the counter will have arrived at a count level, which count level has a completely random quality due to randomness of the noise source. Then the periodic signal will be passed by the signal gate to drive the counter to a filled state at which time the counter will produce an output to control the delta time duration signal source. The appearance of this counter signal output will initiate the enabling of the signal gate to again pass the noise signal to the counter as well as permit the delta time duration signal source to produce an output signal of delta time duration at discrete random time intervals.

An expanding technology coupled with a vastly increased use of radio communication channels has driven the number of available channels or frequencies for communications to a point where there are great demands imposed on users of available channels to use each channel to its maximum. Many sophisticated and complex efforts have been made to accomplish this end. In the area of remotely controlled vehicles, such as trains, the problems that arise in utilizing a single channel or frequency in the control of many vehicles in the same area compounds the purely technical aspect of making maximum use of the channel available. The system parameters that must be entertained deal with the overriding consideration that must be given to fail-safe operation of the vehicles. In other words, if for any reason two or more simultaneous control transmissions are made and any one or more interfere with each other so that some command does not reach the vehicle during a specified time period usually measured in seconds, the vehicle must automatically stop. When this occurs, there may be only a momentary halt to the vehicle movement, that is, until another command is delivered to the vehicle, or in the event that a vehicle is coupled to a series of cars, the time it takes to restore air pressure to the brake system may be as long as five to ten minutes. The ideal system would of course be totally free of any interference or vehicle stoppage, and while such a system may exist, the environment in which this system must function is one where all the command transmitting equipment is placed on the person of the operator. This operator has to carry the transmitting equipment with him for the entire work day. Of necessity the transmitter must be light and compact, and have as its functional goal the ideal performance outlined above. To this end there have been attempts to establish a random quality to the distribution of the transmitted controls in the hope that interference will be avoided. One such system uses the heartbeat of the operator to provide the random quality to the transmissions. This scheme is shown in Letters Patent of the U.S. No. 3,293,-549, granted to H. W. Patterson on Dec. 20, 1966, for Radio Communication System for Control of Locomotives. This approach is a step in the right direction.

Another important parameter to be considered resides in the need to know approximately how frequently a probable failure will occur. Many of the systems in use today have many failures in a single twenty-four hour span; an admittedly intolerable situation which ultimately frustrates the scheduling ability of the party employing the current systems.

To this chaos the invention to be described brings a level of order heretofore unobtainable. The system of this invention makes use of statistical avoidance principles, thereby allowing accurate statistical predictions as to frequency of failure as system parameters, such as number of vehicles and number of commands, are changed. All of this is accomplished with a simplicity that exudes the highest order of invention.

It is therefore an object of this invention to utilize avoidance techniques to allow a number of remote control links to share the same radio channel in a given area.

Another object of this invention is to provide a random time-sharing mode of operation which permits lower power consumption in the operator-carried transmitter, thereby providing savings in battery size plus overall weight of the equipment carried by the operator.

Yet another object of this invention is to provide for a number of operator-vehicle units to operate on the same channel by having each operator's control unit transmit short pulses of radio frequency energy at random time intervals, with a number of these pulses transmitted each second of operation. The randomness of the pulse time spacings is determined by solid state circuitry within the operator's control unit; each pulse containing digital address and control information.

Still another object of this invention is to provide a device which is capable of providing any number of values of discrete randomness at a variable, mean repetition rate by simple parameter changes, the randomness and the repetition to be defined in terms of two system parameters.

In the attainment of the foregoing objects there is employed a delta time duration signal generating system which has discrete random time intervals between the delta time duration signals. The system includes a first signal source for producing a random noise signal and a second signal source for producing a periodic signal. Included in the system is a signal gate unit which is electrically coupled respectively to the first signal source and the second signal source. The signal gate unit itself contains both a first and a second gate electrically coupled respectively to the first signal source and the second signal source. A counter is electrically coupled to the signal gate as well as a delta time duration signal producing means. The first and second gates of the signal source are individually coupled electrically to the delta time duration signal source. Included within the delta time duration signal source is a triggered circuit and a two-state memory unit such as a flip-flop. The triggered circuit is electrically coupled to and driven by an output from the counter. An output signal from the triggered circuit simultaneously provides an input to the memory unit as well as providing a delta time duration output signal. The memory unit has a first and a second output which alternately enable respectively the first and the second gate of the signal gate unit to pass the noise signal and the periodic signal to the counter to respectively drive the counter for the delta time duration, during which time the counter will arrive at a count level, which count level has a completely random quality due to the noise signal produced by the first signal source, and then to drive the counter to a filled state by the periodic signal to thereby provide an output to control the triggered circuit to produce the delta time duration output-signal at discrete random time intervals.

Other objects and advantages of the present invention will become apparent from the ensuing description of illustrative embodiments thereof, in the course of which reference is had to the accompanying drawings in which.

A description of the above embodiments will follow and then the novel features of the invention will be presented in the appended claims.

Figure 1:
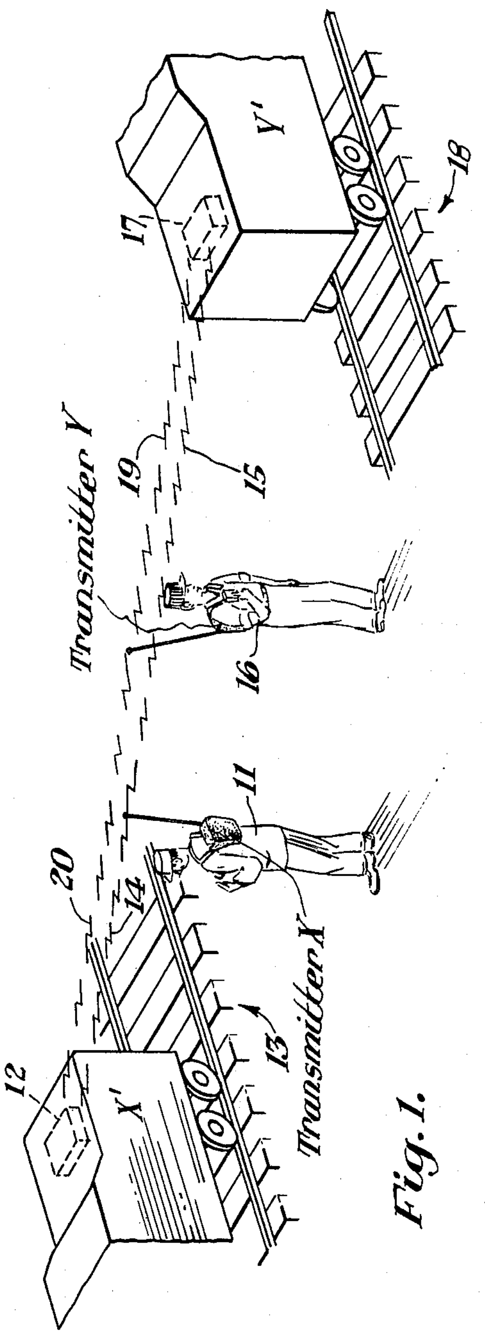
FIG. 1 illustrates a railway environment in which locomotives are being remotely controlled by units employing the invention.

Reference is now made to FIG. 1 in which there is illustrated a typical environment where the invention may be employed. In this instance there is depicted a pair of trains X′ and Y′ positioned on pairs of rails 13 and 18. Each of these vehicles is controlled by an operator 11 or 16 who respectively controls trains X′ and Y′. Each of these operators has a transmitter on his person, operator 11 having transmitter X and operator 16 having transmitter Y. In this elementary situation only two operators are shown controlling two remotely positioned vehicles. Both operators have their transmitters X and Y functioning on the same frequency or channel. In order to graphically illustrate the problem that arises, there is shown emanating from each of the operators 11 and 16, a number of pulses, for example 14 and 20, as well as 15 and 19. It is intended by this graphic illustration to show that the operator 11 is transmitting a message to the vehicle X′, which command message is received by a receiver 12 on the train X′. A number of pulses are shown emanating from the operator 11. These pulses, of course, emanate in a propagation pattern which will send a message simultaneously to both vehicles that are in the area. Accordingly, operator 11 with his transmitter X is transmitting simultaneously the same message to both trains. Of course, the problem may arise that should two signals, one from each operator, arrive at the same time at the respective trains X′ and Y′ and their receivers 12 and 17, these signals would conflict and be rejected by the receivers, thereby failing to establish a communication link to control either of the trains.

Figure 2:
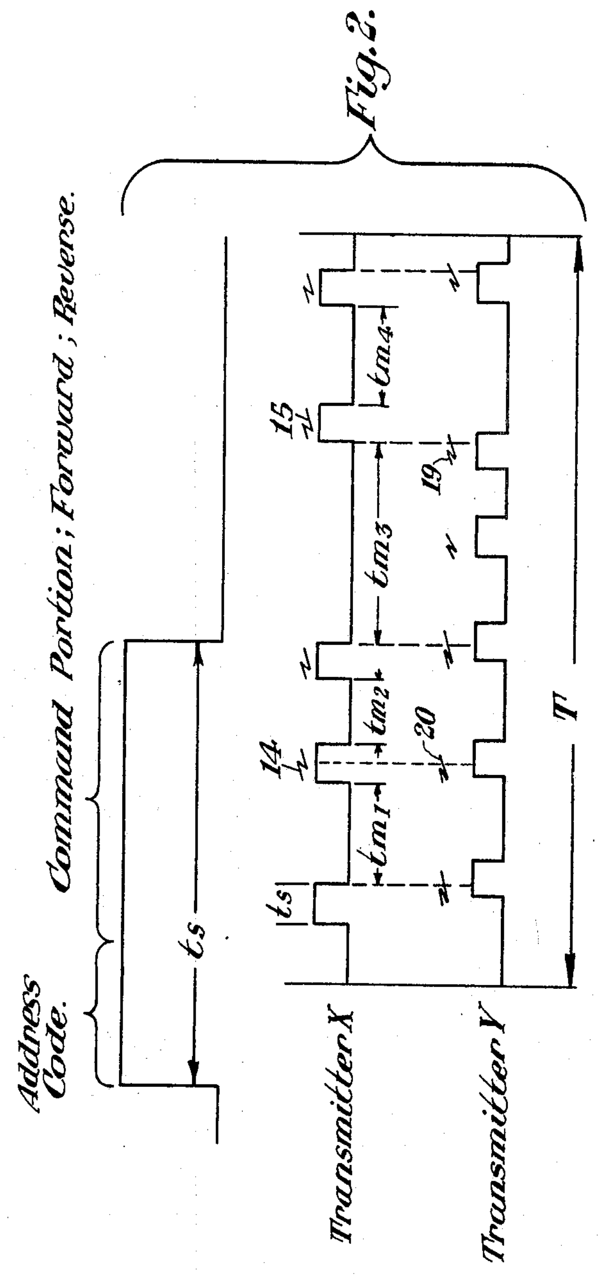
FIG. 2 represents a series of pulse trains that are the subject of control by the invention.

Reference is now made to FIG. 2 which shows a number of code patterns, and FIG. 2 is to be studied in conjunction with FIG. 1. In the uppermost portion of FIG. 2 there is shown a waveform which is measured in time and has a specific length $t_s$. This length of the pulse which is to carry the coded information to control the vehicles is comprised of two portions. A first portion designated the "address code" is the time needed to provide a distinct address code imposed upon the transmitted signal in order to control a specific remote vehicle. The rest of the time $t_s$ is made up of a portion of time of sufficient length to provide the digital command information such as forward, reverse, blow the whistle, etc. The number of commands to be employed determines of course the total remaining portion of the time of the transmission $t_s$ necessary to perform this function. Therefore, it will be appreciated that the time $t_s$ measured in milliseconds is a basic parameter which must be considered in designing any system where more than one message will be transmitted over the same frequency.

Immediately beneath the pulse designated by $t_s$, there is shown a typical problem situation which may arise in the field and by this presentation it is intended to show the conflicts that may arise. Transmitter X positioned on the back of operator 11 and the train pulse which emanates from this transmitter is shown on the line designated as the output from transmitter X. As has been noted earlier, there has been selected a time span T during which some message must be received by either one of the receivers 12 and 17 of the vehicles X′ and Y′. Accordingly, the selection of the total time T, shown at the bottom of this figure, is a significant parameter for reasons that will become more evident as the discussion goes on. This figure is intended to show the problem of conflicting signals. On the line designating the output from transmitter X, the first pulse that appears of duration $t_s$ will be seen to be overlapping the first transmitted pulse from transmitter Y on the line below. With these two signals conflicting no message would be received by either vehicle because the receivers on the vehicles would reject the conflicting signals which appeared about the same time at both receivers.

In order to more graphically point out the conflict the next pulse on each line, designated by the jagged lines 14 and 20 both in the outputs from transmitter X and transmitter Y, may also be seen in FIG. 1 positioned in space approximately the same distance from each of the operators. This illustration is only to permit a graphic presentation of the signals conflicting when the same frequency or channel is employed by both transmitters. Accordingly, as one traces the outputs from transmitter X and transmitter Y, it will be seen that this next succeeding signal after 14 and 20 from transmitters X and Y, respectively, also conflicts but finally a pulse 19 from transmitter Y appears at a time when there is no corresponding signal present from transmitter X. This single pulse from transmitter Y would thereby initiate the control action desired in the vehicle Y′.

Following both the outputs from transmitters X and Y it will be seen that the output pulse designated 15 from transmitter X conflicts with the next pulse after the pulse 19 from the transmitter Y, as well as the last two pulses from transmitter X and transmitter Y which conflict in a similar fashion.

The overall result of such conflicting signals, as depicted here, would result in the transmitter X during the time T never having transmitted an acceptable message. Accordingly, the equipment carried by the train would immediately initiate a stopping or brake application and bring this train to a halt, while the train Y', which did receive a message unit referred to as pulse 19, would continue its operation assuming that there were in the next time span to follow no conflicting pulse problems of the type here defined.

Between each of the pulses of duration $t_s$ there is a time between pulses arbitrarily designated here and shown with reference to transmitter X as a span between pulses $t_{m1}$, $t_{m2}$ and $t_{m3}$, $t_{m4}$. These $t_m$'s measure the distance between pulses and their meaning will be made more evident in a mathematical analysis of the statistical time avoidance problem to be solved by the invention described hereafter.

The equation that follows approximates closely the probability of failure in one second, that is to say, the probabili.y of signals interfering. This equation is not to be treated as a perfect expression of probability but is intended only to aid in the ultimate computation of the statistical mean time between failures. It is for this reason that the derivation is not included, for the invention resides in the creation of the system which operates with the parameters of the equation in a predictable manner as evidenced by extensive testing. Accordingly, the probability of failure in one second=

$$P_F=\left[1-\left(1-\frac{2}{R}\right)^{(l-1)}\right]^{\lambda}$$

where:

$\lambda=1/t_m$=average number of transmissions in one second (see FIG. 2, for $t_m$ which is depicted as "$t_{m1}$, $t_{m2}$")

$l$=the number of locomotives to be controlled which of course dictates the number of transmitters to be employed $R=t_m/t_s$, and where R has been approximated by the following equation $$R_{(\text{approx.})}=3l-\left(1+\frac{l}{30}\right)$$

In the description that follows concerning the apparatus to carry out the invention it will be seen that by merely changing the values of two parameters, namely, the number of stages in a counter and the frequency of a periodic signal source we can obtain any population of discrete random intervals at any given mean number per second. Accordingly, the $$\text{frequency of the periodic signal source}=f_p=\frac{\lambda\sum_{n=0}^{n=2^{(n-1)}}K}{2^{(n)}-1}$$

where:

$n$=the number of stages in the counter $k$=1 and is a constant

Before a description of the system takes place there is presented below a chart which illustrates the manner in which the random time interval generator performs as certain of the parameters assume new values for varying numbers of vehicles to be controlled as well as for systems where the time T, as depicted in FIG. 2, is changed from one second to three.

| No. of Trains ($l$) | $\sim R$ | $\sim\lambda$ | Freq. of Periodic Source ($f_p$) | Probability of failure for one second ($P_F$) |
|---|---|---|---|---|
| 2 | 5 | 12.5 | 400 | $10^{-5}$ |
| 3 | 8 | 7.8 | 250 | $1.58\times10^{-4}$ |
| 4 | 10.8 | 5.9 | 200 | $9.7\times10^{-3}$ |
| 5 | 13.8 | 4.5 | 145 | $2.92\times10^{-2}$ |
| 9 | 25.7 | 2.4 | 78 | $1.44\times10^{-1}$ |

Where number of stages in counter $=n=6$.

Putting the last column into more meaningful terms

| Interval T=1 second | | Interval T=3 seconds | |
|---|---|---|---|
| | | Mean Time Between Failures | |
| No. of Trains ($l$) | No. of Seconds Between Failures | In Seconds | In Hours |
| 2 | $10^5$ | $10^{15}$ | $2.8\times10^{17}$ |
| 3 | $6.3\times10^3$ | $2.5\times10^{11}$ | $7\times10$ |
| 4 | $1.03\times10^2$ | $1.1\times10^6$ | 300 |
| 5 | $3.42\times10^2$ | $3.7\times10^4$ | 10 |
| 9 | 6.94 | $3.35\times10^2$ | .1 |

Figure 3:
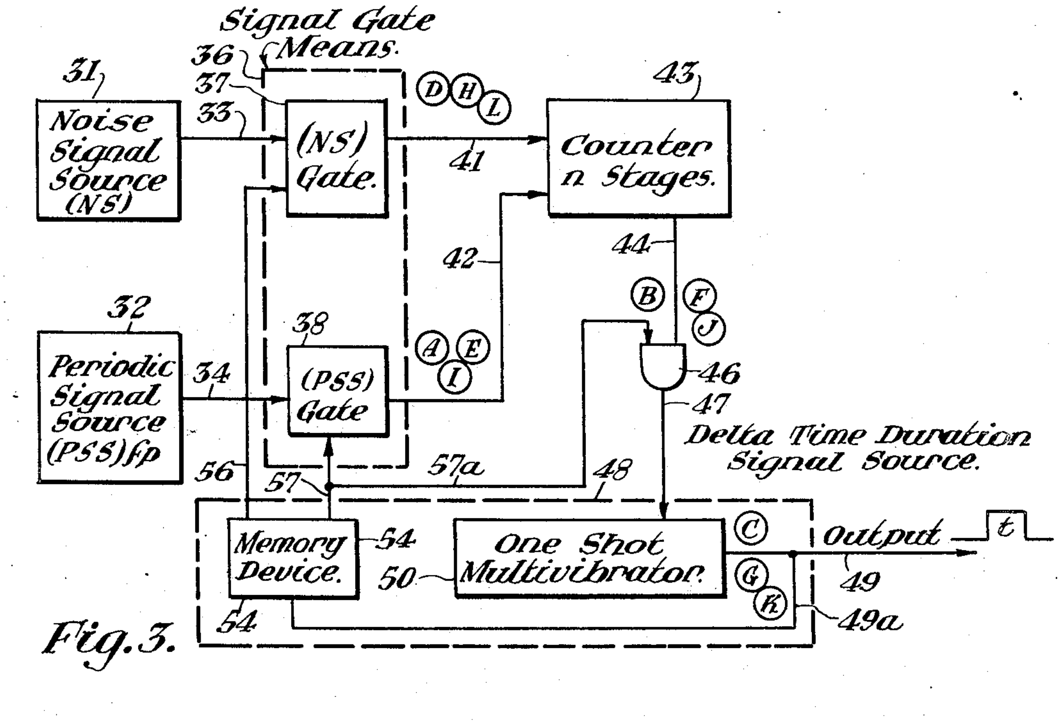
FIG. 3 is a block diagram embodying the invention.

Reference is now made to FIG. 3 which depicts in block diagram form an embodiment of the invention. When the system is at rest as, for example, when the system is first started in operation, there will be an output from a noise signal source 31, as well as a periodic signal from a periodic signal source 32. These two sources are always on. Illustrated immediately beneath FIG. 3 is FIG. 4 which depicts a series of waveforms which will appear in the description that follows and is presented here to aid in an understanding of the operation of the random time signal generator which is the subject of this invention.

Figure 4:
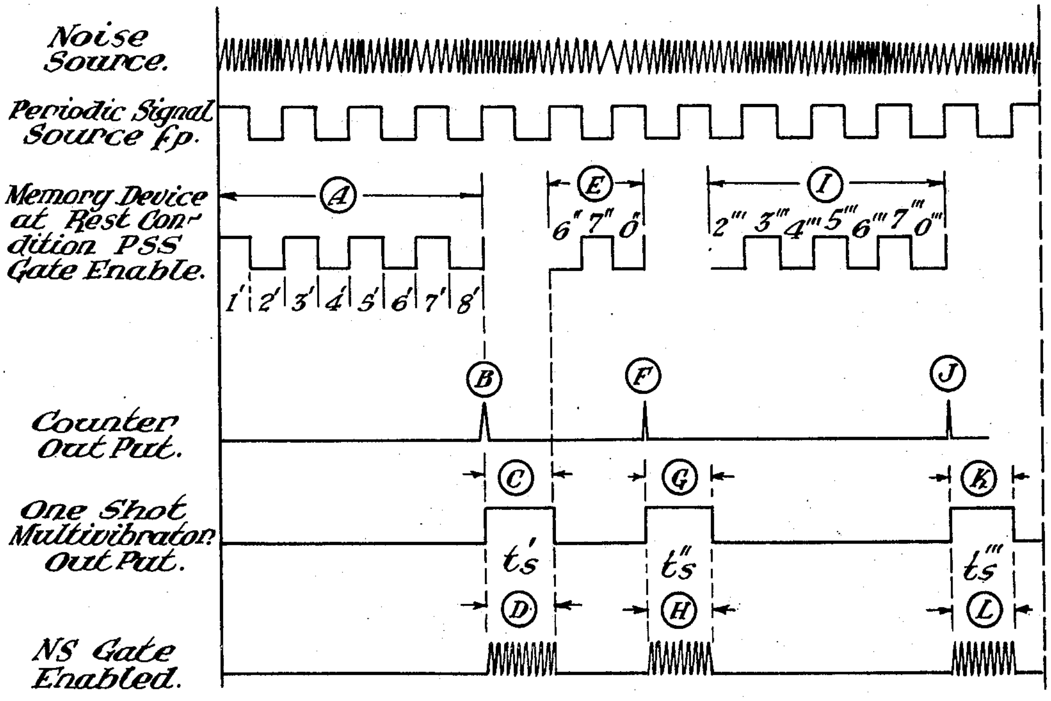
FIG. 4 depicts a series of waveforms plotted against time to facilitate an understanding of the operation of the invention illustrated in FIG. 3.

At the very top of FIG. 4 there is shown the pattern of the noise signal source 31 measured against time extending to the right, and immediately beneath the noise signal source in FIG. 4 is shown the periodic signal source having a frequency of $f_p$. Beneath both the noise signal source and the periodic signal source are illustrated the pulses that appear at a number of different points throughout the system shown in FIG. 3. Accordingly, portions of the pulse trains that appear at different points in the system are designated by circled reference characters A, B, and C through L, and these waveforms have been designated at different points in the block diagram depicted in FIG. 3. For example, the waveform shown immediately beneath the periodic signal source pattern in FIG. 4 is a reference character A which designates in this exemplary situation eight pulses from the periodic signal source, which eight pulses would appear in a sequential operation where the circled reference character A appears in FIG. 3.

Before going into a detailed description of the operation of the system there will be described at this time the cooperation of the various components within the system.

Accordingly, the noise signal source 31 produces an output having a totally random quality with reference to the frequency. This noise signal source may typically be a noise junction diode and the periodic signal source 32 will have a pulse rate of the type indicated in the chart immediately preceding this section; the frequency of the periodic signal source of course is a function of the equation enumerated above. Immediately to the right of the noise signal source 31 and the periodic signal source 32 is a signal gate means 36 with respective leads 33 and 34 emanating from the two signal sources just noted and entering the signal gate means 36. These leads 33 and 34 are respectively applied to a first gate 37 and a second gate 38. The first gate 37 and the second gate 38 also have connected thereto electrical leads 56 and 57 which emanate from a memory device 54 located in a delta time duration signal source 48. The memory device referred to in this instance may be an ordinary flip-flop, one which changes the output states appearing on the leads 56 and 57 dependent upon the presence of an input signal to the memory device 54 over the lead 49_a_. The appearance of a signal on the lead 49_a_ and how it is derived will be described hereafter. Suffice it to say at this time that the outputs that appear on leads 56 and 57 will alternately be "on" and "off" for a specific duration of time. When, for example, there is an output present on the lead 57, there will be none on lead 56. This output will enable the second gate 38 to pass the periodic signal appearing on the lead 34 entering the second gate 38 on the left-hand side. This periodic signal will then be passed over the electrical lead 42 to a counter 43. On the other hand, when a signal appears on lead 56 and no signal is present on lead 57, the first gate 37 will be enabled and it will allow the passage of, for the duration of time that a signal is present on the lead 56, the noise signal delivered to the first gate over the electrical lead 57. This noise signal will pass over the electrical lead 41 from the first gate into the counter. The counter and the first and second gate, as well as the flip-flop may be of the type depicted in an article titled "Solid State Devices" by P. N. Bossart, pages 13 to 23, in Railway Signaling and Communications Magazine, April 1963.

Immediately beneath the counter 43 is an AND gate 46 connected respectively by electrical lead 44 from the counter 43 and by lead 57*a* from lead 57 which originates in the memory or flip-flop device 54. It will be appreciated that the only time that an output from the counter will be delivered through the AND gate 46 will occur when there appears a signal on the lead 57 from the memory device 54 which in turn will place an output on the lead 57*a* to the gate 46. Accordingly, when the counter 43 has been filled, it will produce an output signal on the lead 44 and the simultaneous presence of the signal on lead 57*a*, as well as lead 44 from the counter 43, will permit a pulse to appear on the electrical lead 47, which electrical lead 47 enters the delta time duration signal source 48, and specifically this signal will enter the one-shot multivibrator 50 here depicted within the delta time duration signal source 48. This one-shot multivibrator, or trigger circuit as it may be termed, will produce a signal output of a fixed time duration. This signal and its length as measured by time will be selected to be as long as the time $t_s$ referred to in FIGS. 1 and 2. As soon as the one-shot multivibrator 50 has received a pulse, it in turn will produce a signal output on the electrical lead 49, which signal will have a length equivalent to $t_s$. This output signal will be utilized in the transmission of information signals to the remote units to be controlled by the employment of this invention.

Simultaneously with the delivery of the output signal on the electrical lead 49, which emanates from the one-shot multivibrator 50, there will be the same delta time duration signal here referred to as $t_s$ on electrical lead 49*a*, which in turn will activate the memory device or flip-flop 54 to alternately energize the leads 57 and 56 to respectively enable the gates 38 and 37 of the signal gate means 36.

It should be understood that in this particular environment there has been depicted the gate 46 which functions to permit the passage of a signal to the one-shot multivibrator 50 only when the electrical leads 57 and 57*a* are in an energized condition. This AND gate need not be included in every situation as, for example, when a one-shot multivibrator is selected as a triggering circuit because the appearance of an output from the counter 43 to the one-shot multivibrator while it is in its "on" state producing the delta time duration signal output signal $t_s$, the appearance of a signal from the counter will have no effect on the one-shot multivibrator. This AND gate 46 has been added to cover those situations where the system does not of necessity include a one-shot multivibrator but includes some other triggering circuit or component which may be affected by the appearance of a signal to the trigger circuit while it is producing a delta time duration signal output. Accordingly, it will be appreciated that while this system is illustrated in the form of a solid state electronic device, it may be readily adaptable to include fluid state logic as all the components herein are readily duplicated by fluidic logic components. At this time a functional description of the system will ensue, in which the waveforms which appear in FIG. 4 will be correlated with the actual operation of the random time function signal generator shown in FIG. 3.

As noted earlier, wherever a circled reference character is employed in FIG. 3, its equivalent signal pattern will appear in FIG. 4 in the time sequence shown in FIG. 4. FIG. 4, of course, is therefore to be read with the awareness that the entire system will repeatedly recycle itself and that for purposes of this discussion we will arbitrarily assume that the counter 43 requires eight counts or eight pulses to bring the counter to a full state before it will produce an output signal on the lead 44. Keeping this in mind it will be seen as we view FIG. 4 that, with a signal present on the lead 57 from the memory device 54, the second gate 38 will be thereby enabled and the periodic signal source 32 will pass a pulse train over electrical lead 34 through the second gate 38 to the electric lead 42. There appears immediately to the right of the second gate 38 the circled reference character A which indicates, as may be seen in FIG. 4, that eight pulses have been delivered to the counter 43. When these gate pulses have been delivered to the counter 43 it will be in its filled state, and immediately upon the filling of this counter a pulse will appear on the lead 44. This pulse that appears on the lead 44 is designated by a circled reference character B in both FIG. 3 and FIG. 4.

It will be understood from the foregoing that since there was a signal present on the leads 57 and 57*a*, the AND gate 46 has been placed in a condition to pass the signal produced by the counter 43 which appeared on the electrical lead 44 from the counter 43. This brief pulse will pass over the electrical lead 47 to the one-shot multivibrator 50 of the delta time duration signal source 48, and its appearance will cause an output $t_s$, from the one-shot multivibrator designated by circled reference character C in both FIGS. 3 and 4 to appear on the output lead 49 as well as lead 49*a* to the memory device 54, which will therefore render an output on electrical lead 56 while removing the signal present on lead 57. With a signal present on the output lead 56 from the memory device 54, it will be seen that the first gate 37 is now enabled and will permit the passage of a noise signal from the noise signal source 31, which noise signal is present on lead 33. This noise signal will therefore pass to the counter 43 over the lead 41 and the gate 37 will continue to pass this noise signal to the counter 43 for the time duration $t_s$ measured by the output of one-shot multivibrator 50 or trigger circuit previously noted. In other words, the counter will experience the delivery over the lead 41 of the noise signal from the noise signal source 31 and this will cause the counter 43 to be repeatedly filled because the noise signal contains many high frequencies, and eventually when the time $t_s$, or the delta time duration as it is being referred to here, has elapsed, as measured by the output from the multivibrator 50, the first gate 37 will cease to pass the noise signal. We have shown for purposes of illustration only the hypothetical situation where the counter 43, after being driven a number of times to its filled state, has stopped at the end of count 5, therefore leaving the counter in a semi-filled state requiring at least three more counts before the counter will be filled and produce an output signal.

Accordingly, when the $t_s$ or delta time duration is over and the memory device 54 produces an output upon lead 57, the second gate 38 will proceed to pass a periodic signal from the periodic signal source 32 over the lead 34, thence through the lead 42 to the counter 43. As soon as the counter 43 has received the three pulses necessary to fill it, as shown by circled reference character E on the output side of the second gate 38, and in the third line of the chart in FIG. 4, the counter 43 will produce an output signal on the lead 44, which has been designated by circled reference character F in both FIG. 3 and FIG. 4, and as has been noted the appearance of a signal on the lead 57, as well as lead 57*a*, will permit the passage by the AND gate 46 of the output signal from the counter 43. This in turn will cause a signal to appear on the lead 47 which in turn will drive the one-shot multivibrator or trigger circuit 50 to produce another delta time duration signal $t_s$ on the output 49. This output signal $t_{s''}$ is designated by the circled reference character G in both FIGS. 3 and 4. Accordingly, the delivery of this signal represented by the reference character G for a period of time $t_s$ will cause the memory device 54 to produce an output on electrical lead 56, which in turn will enable the first gate 37 which therefore will pass the noise signal from the noise signal source 31 over the electrical lead 33 to the first gate 37, the electrical lead 41 to the counter 43.

It should be recognized that since the noise signal source at this point in time, as designated by the circled reference character H in both figures, is totally random in its nature, it will produce an output to the counter which hypothetically for purposes of explanation may in this instance have brought the counter to a 1 count when the end of the delta time or $t_{s''}$ period has elapsed. In this instance then we would see, as the circled reference character I indicates, that there would be required seven more pulses to be passed by the second gate 38 to the counter 43 before the counter would produce an output to the one-shot multivibrator 50. Accordingly, when this output appears on lead 44 from the counter 43, as has been noted with the gate 46 enabled because of the signal present on leads 57 and **57*a*, a new cycle would start with the one-shot multivibrator 50 producing a signal $t_{s'''}$ designated by the circled reference character K which then would permit the passage of the noise signal from the noise signal source by the first gate 37** which has been designated by the circled reference character L and the cycle would repeat.

It has been established that this arrangement will follow the equation set forth and will produce the type of random quality that is so essential to the predictable functioning of a system of this nature. It can be seen from the above that the overall arrangement contains a minimum of components all of which may be of a solid state nature requiring very little room and very little weight, coupled with the fact that since the system is a pulsed system the drain on the batteries for the power supply carried by the operator will be kept to a minimum. This system, as depicted in FIG. 3, may be expanded as shown in the chart earlier described to include various numbers of commands, as well as a multiplicity of different trains or vehicles or stations to be transmitted to in a wholly predictable manner as established by the equation set forth earlier.

While the present invention has been illustrated and disclosed in connection with the details of the illustrative embodiments thereof, it should be understood that those are not intended to be limitative of the invention as set forth in the accompanying claims.

Having thus described my invention, what I claim is:

1. A delta time duration signal generator having discrete random time intervals between said delta time duration signals and having a first signal source for producing a random noise signal and a second signal source for producing a periodic signal in combination with (a) a signal gate means operatively coupled respectively to said first signal source and said second signal source, (b) a counter means operatively directly coupled respectively to said signal gate means to receive signals passed by said signal gate means and to a delta time duration signal producing means, said delta time duration signal producing means directly electrically coupled to said signal gate means to thereby control said signal gate, (c) said delta time duration signal producing means alternately enabling said signal gate means to pass said noise signal and said periodic signal to said counter means to respectively drive said counter means for said delta time duration, during which said counter will arrive at a count level which count level has a completely random quality due to said noise signal produced by said first signal source and then to drive said counter to a filled state by said periodic signal to thereby control said delta time duration signal source to thereby initiate the enabling of said signal gate means to again pass said noise signal to said counter means and simultaneously permit said delta time duration signal source to produce an output signal of delta time duration at discrete random time intervals.

2. The random time signal generator of claim 1 wherein said signal gate means includes a first and a second gate operatively coupled respectively to said first signal source and said second signal source as well as to said delta time duration signal source.

3. The random time signal generator of claim 2 wherein said delta time duration signal source includes a triggered circuit coupled to and driven by an output from said counter means, said triggered circuit having an output signal which simultaneously is fed to a two-state memory means and provides said output signal of delta time duration at discrete random time intervals.

4. The random time signal generator of claim 3 wherein said triggered circuit is a one-shot multivibrator.

5. The random time signal generator of claim 4 wherein said two-state memory device is a flip-flop having a first and second output which alternately enable said first and said second gate to pass respectively said noise signal to said counter means and said periodic signal to said counter means.

6. The random time signal generator of claim 5 wherein a third gate means enables said delta time duration signal source in accordance with the presence of said second output from said flip-flop and said signal from said counter means.

7. The random time signal generator of claim 6 wherein said third gate is an AND gate.

8. A delta time duration signal generating system having discrete random time intervals between said delta time duration signals and having a first signal source for producing a random noise signal and a second signal source for producing a periodic signal, said generator to be used in statistical avoidance time showing systems and comprising in combination:

(a) a signal gate means electrically coupled respectively to said first signal source and said second signal source, said signal gate means including a first and a second gate electrically coupled respectively to said first signal source and said second signal source, (b) a counter means electrically coupled to said signal gate means and a delta time duration signal producing means, said first and said second gate of said gate means individually coupled electrically to said delta time duration signal source, (c) said delta time duration signal producing means including a triggered circuit and a two-state memory means, said triggered circuit electrically coupled to and driven by an output from said counter means, said triggered circuit having an output signal which simultaneously provides an input to a two-state memory means and also provides a delta time duration output signal, said memory device having a first and a second output which alternately enable respectively said first and said second gate to pass said noise signal and said periodic signal to said counter means to respectively drive said counter means for said delta time duration, during which time said counter will arrive at a count level which count level has a completely random quality due to said noise signal produced by said first signal source and then to drive said counter to a filled state by said periodic signal to thereby provide a counter means output to control said triggered circuit to produce said delta time duration output signal at discrete random time intervals.

9. The random time signal generator of claim 8 wherein said triggered circuit is a one-shot multivibrator.

10. The random time signal generator of claim 9 wherein said memory device is a flip-flop.

11. The random time signal generator of claim 8 wherein a third gate means enables said delta time duration signal source in accordance with the presence of said second output from said memory device and a signal from said counter means.

12. The random time signal generator of claim 11 wherein said third gate is an AND gate.

References Cited

UNITED STATES PATENTS

| | | | |
|---|---|---|---|
| 3,049,676 | 8/1962 | Zinke | 331—78 |
| 3,124,753 | 3/1964 | Geiseler | 328—61 |
| 3,208,008 | 9/1965 | Hills | 331—78 |
| 3,366,779 | 1/1968 | Catherall et al. | 331—78 X |

JOHN S. HEYMAN, Primary Examiner

U.S. Cl. X.R.

331—78